United States Patent
Reitz et al.

(10) Patent No.: US 11,486,937 B2
(45) Date of Patent: Nov. 1, 2022

(54) ELECTRIC CIRCUIT ARRANGEMENT AND A METHOD FOR THE FUNCTIONAL TESTING OF A MONITORING DEVICE FOR AN ELECTRIC POWER SUPPLY SYSTEM

(71) Applicant: Bender GmbH & Co. KG, Gruenberg (DE)

(72) Inventors: Julian Reitz, Gruenberg (DE); Karl Schepp, Reiskirchen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 12 days.

(21) Appl. No.: 17/243,672

(22) Filed: Apr. 29, 2021

(65) Prior Publication Data
US 2021/0341542 A1    Nov. 4, 2021

(30) Foreign Application Priority Data
Apr. 30, 2020    (DE) ..................... 10 2020 111 807.4

(51) Int. Cl.
| | |
|---|---|
| *G01R 31/40* | (2020.01) |
| *G01R 31/12* | (2020.01) |
| *H02M 3/155* | (2006.01) |

(52) U.S. Cl.
CPC ......... *G01R 31/40* (2013.01); *G01R 31/1272* (2013.01); *H02M 3/155* (2013.01)

(58) Field of Classification Search
CPC .... G01R 31/40; G01R 31/1272; G01R 27/18; G01R 31/52; G01R 35/00; G01R 31/00;
(Continued)

(56) References Cited

U.S. PATENT DOCUMENTS

| 3,868,665 | A | 2/1975 | Treglown | |
|---|---|---|---|---|
| 8,395,404 | B2 * | 3/2013 | Kaku | ................ H01L 23/49838 324/750.3 |

(Continued)

FOREIGN PATENT DOCUMENTS

| DE | 102014217370 A1 | 3/2015 |
|---|---|---|
| DE | 102018125004 B3 | 12/2019 |

(Continued)

*Primary Examiner* — Giovanni Astacio-Oquendo
(74) *Attorney, Agent, or Firm* — Dickinson Wright PLLC; Andrew D. Dorisio

(57) ABSTRACT

The invention relates to an electric circuit arrangement (20) for the functional testing of a monitoring device (4) for a power supply system (2), the electric circuit arrangement (20) having a test resistance ($R_{f1}$, $R_{f2}$) which is switched between an active conductor ($L_1$, $L_2$) of the power supply system (2) and ground (PE) and has a settable actual resistance value ($R_x$). In this context, a bidirectional cascade (12) consisting of field-effect transistors as test resistances ($R_{f1}$, $R_{f2}$) and an analog control (10) for the continuous-value setting of the actual resistance value ($R_x$) to a predefined target resistance value ($R_0$) are provided.

Furthermore, the invention relates to a modular circuit arrangement (60) consisting of several electric circuit arrangements (20) according to the invention, each of the electric circuit arrangements (20) being assigned a different active conductor ($L_1$, $L_2$) of the electric power supply system (2), and a central control unit (50) being implemented for controlling and monitoring the electric circuit arrangements (20).

16 Claims, 4 Drawing Sheets

(58) Field of Classification Search
CPC .... G01R 19/165; G01R 27/025; G01R 27/16; H02M 3/155
USPC .................................. 324/764.01, 537, 500
See application file for complete search history.

(56) References Cited

U.S. PATENT DOCUMENTS

| | | | |
|---|---|---|---|
| 2012/0249151 A1* | 10/2012 | Dobusch | H02H 3/335 324/424 |
| 2014/0292365 A1 | 10/2014 | Said | |
| 2015/0268288 A1* | 9/2015 | Schlueter | G01R 31/58 324/511 |

FOREIGN PATENT DOCUMENTS

| | | |
|---|---|---|
| EP | 1162470 A1 | 12/2001 |
| EP | 3246715 A1 | 11/2017 |

* cited by examiner

ELECTRIC CIRCUIT ARRANGEMENT AND A METHOD FOR THE FUNCTIONAL TESTING OF A MONITORING DEVICE FOR AN ELECTRIC POWER SUPPLY SYSTEM

This application claims the benefit of German Patent Application No. 10 2020 111 807.4, filed April 30, 2020, the disclosure of which is incorporated herein by reference.

TECHNICAL FIELD

The invention relates to an electric circuit arrangement and a method for the functional testing of a monitoring device for an electric power supply system, the electric circuit arrangement having a test resistance which can be switched between an active conductor of the power supply system and ground and has a settable actual resistance value.

BACKGROUND

Furthermore, the invention relates to a modular circuit arrangement consisting of several electric circuit arrangements according to the invention.

Safety protocols for electric installations, such as power supply systems and operating means connected thereto, and requirements regarding protective measures for ensuring electrical safety are becoming increasingly important in a national economy dependent on the supply of electric energy. Not only does the proper selection of suitable monitoring devices play a decisive role in this situation as their proper functioning is of equal importance for the early detection of (insulation) faults and for preventing downtimes of the electric installation and related costs caused by the faults.

To monitor an ungrounded power supply system (French: Isolé Terre—IT network), standard IEC 615578 therefore prescribes the use of an insulation monitoring device (IMD) as a monitoring device. In grounded power supply systems, a residual-current monitoring device (RCM) undertakes the monitoring as prescribed in standard IEC 62020.

These monitoring devices must therefore be tested for a function conforming to standards by means of a test at initial operation and recurring tests in specified test intervals over the entire period of use.

Measuring methods for determining the insulation resistance in un-grounded power supply systems are generally based on the superposition of a measuring voltage generated in the insulation monitoring device, meaning a measuring current proportional to the insulation fault (fault resistance) is set which causes a corresponding voltage drop at a measuring resistance of the insulation monitoring device. If the voltage drop exceeds a certain value in consequence of a decreased insulation resistance and thus a higher measuring current, an alarm notification is triggered.

For the functional testing of the standardized insulation monitoring device, a test resistance having a defined resistance value is supplied to the network between one or several active conductors and ground as a fault resistance, the network being monitored by the insulation monitoring device.

The manner in which a residual-current monitoring device in grounded power supply systems operates is based on the fact that the vectorial sum of the currents on all active conductors of a supply line equals zero during fault-free operation of the electric installation and that consequently no magnetic field exists in a magnetizable ring core of a measuring-current transformer of the residual-current monitoring device, wherein the ring core encircles the supply line. If a fault current, which drains off outside of the supply line via a body or ground, occurs because of an insulation fault, a residual current is yielded. The changing magnetic field of this residual current induces a voltage, which triggers an alarm signal, in a secondary winding of the measuring-current transformer when a preselected value of the residual current is exceeded.

For the functional testing of the standardized residual-current monitoring device, a test resistance having a defined resistance value is to be switched as a fault resistance which generates an artificial fault current "led past" the ring core of the residual-current monitoring device.

Specification EP 3 246 715 B1 discloses a method and a device for the functional testing of an insulation monitoring device in which two different insulation resistances (fault resistances) are switched in repeating test cycles and the reaction of the insulation monitoring device, i.e., the operating state in that moment, is evaluated.

The company Gossen Metrawatt discloses a test device (test apparatus; http://www.gmc-instruments.de/media/de/product_manuals/profi-test-master-seculifeip-iq-ba_d.pdf) in which one-phase faults having discrete resistance values and manual trigger-time detection can be generated for the functional testing of the insulation monitoring device.

Furthermore, so-called "fault plugs" are available on the market which switch an installed fault resistance to ground. For this purpose, large, heavy and, depending on the application, electrically unsafe resistance decades are used for generating faults for maintenance purposes.

All solutions disclosed in the state of the art above carry the disadvantage of only discrete resistance values being able to be switched. However, as particularly high-quality insulation monitoring devices dispose over a plurality of specific measuring profiles, it does not suffice to conduct measurements using merely one specific resistance value or a temporal progression of discrete resistance values with respect to ensuring the functional safety. In fact, resistance progressions are of interest for functional testing, the resistance progressions being able to simulate real system behavior of the electric installation including occurring symmetric faults; however, the switching-on and off of the fault resistances (test resistances) must not lead to an inadmissible current load of the electric installation.

Specification DE 10 2018 125 004 B3 discloses a change in the resistance value of a transistor cascade controlled by means of a control circuit. This transistor cascade does not act as a test resistance but as a coupling impedance for an insulation monitoring device, a soft switching-on and off of the coupling impedance not being envisioned for preventing over-currents.

Further disadvantages of the available test devices are that manual intervention for recording a measuring parameter, such as the trigger time, is often required.

Moreover, known test devices are often unsuitable for mobile use due to their installation size and large weight.

SUMMARY

The object of the invention is therefore to devise an electric circuit arrangement and a method for the functional testing of a monitoring device for a power supply system, in particular an insulation monitoring device and a residual-current monitoring device. The technical teaching of the invention is intended to be flexibly adaptable to the measuring environment and the measuring task (from a technical point of view), the electric circuit arrangement also being intended to be able to be produced inexpensively and used flexibly (economically) in reference to installation size and weight.

This object is attained by the electric circuit arrangement comprising a bidirectional cascade consisting of field-effect transistors as a test resistance and an analog control for the continuous-value setting of the actual resistance value to a predeterminable target resistance value.

The innovative idea realized using the invention consists in, first, using a bidirectional cascade consisting of field-effect transistors as a test resistance instead of discrete ohmic resistances, the field-effect transistors not being used as switches, as is common practice from a technical point of view, but as a changeable ohmic resistance. The bidirectional cascade consists of a series circuit of two inversely disposed field-effect transistors.

In power operation, the field-effect transistors cannot be operated in the linear operation range but nearly exclusively in the saturation range. For this reason, the field-effect-transistor cascade is forced to an ohmic behavior by an analog control circuit when the saturation range is prevalent and functions in the first and third quadrant of a set of characteristic curves of the field-effect-transistor cascade because of the bidirectionality. This allows operation for direct voltage as well as alternating voltage.

A second core element of the invention is the analog control by means of a control circuit for the continuous-value setting of the resistance value for the test resistance. By means of a controlled resistance change, the resistance value of the bidirectional cascade consisting of field-effect transistors is controlled to a predeterminable target resistance value in a closed loop circuit. The control circuit controls the field-effect transistors in its set of characteristic curves in such a manner that an ohmic resistance characteristic arises.

The combination according to the invention of the field-effect-transistor cascade and their analog control forms a continuous-value equivalent to a discretely changing setting of the resistance value from the point of view of circuitry technology.

Besides the purely technical advantage of flexible use enabled by the continuous-value setting of the resistance value, a technological and economical advantage lies in the installation size and the weight being able to be massively minimized, whereby the required amount of material is simultaneously decreased, by using only two field-effect transistors instead several individual resistances. This aspect comes to fruition in particular for power applications in power supply systems, e.g., when imprinting ohmic fault resistances between an active conductor and ground potential.

Furthermore, in regard to technology, another advantage lies in a hypothetically infinitely high resolution of the settable resistance value being able to be attained because of the analog control, the settable resistance value ultimately being determined only by the resolution of the digital target value specification.

Advantageously, the change of the resistance value can be continuous-value and continuous-time due to the analog control, as no switching processes take place. This is not readily implementable in known, discretely switched resistance decades.

The continuous-value and continuous-time setting of the resistance values enables a (fault) resistance progression for testing the monitoring function for which a real system behavior can be simulated.

In another advantageous embodiment, the control comprises:

a transformation block which transforms the predeterminable target resistance value to a target voltage as a reference variable by means of an actual current;

a current measurement device which detects a transistor current flowing through the transistor cascade and supplies the transistor current to the transformation block in a scaled manner as the actual current;

a comparison element which compares the target voltage to an actual voltage and forms a differential voltage as a control deviation;

a voltage measurement device which detects a transistor voltage dropping across the transistor cascade and supplies the transistor voltage to the comparison element in a scaled manner as the actual voltage; a controller which generates an actuating variable from the differential voltage for controlling a control path which is formed by the transistor cascade having the resistance value as a control variable;

a controllable switch device which switches the actual voltage to zero to shut down the control.

The test resistance with its changeable resistance value as control variable is realized as a bidirectional transistor cascade and forms the control path of the control circuit. Within the control path, the bidirectional transistor cascade is connected downstream of a transistor driver circuit, which is controlled by the actuating variable provided by the controller.

The controller in turn generates the actuating variable from the differential voltage generated in the comparison element.

The differential voltage represents the control deviation between the target voltage and the actual voltage, the voltage measurement device detecting the transistor voltage dropping across the transistor cascade and supplying it to the comparison element in a scaled manner as the actual voltage.

The target voltage is identified as the reference variable from a predeterminable target resistance value by means of the actual current in the transformation block.

The transistor current flowing through the transistor cascade is detected by the current measurement device and supplied to the transformation block in a scaled manner as the actual current.

For setting a desired resistance value for the test resistance, a target value of the resistance value is specified for the control. The desired resistance value sets in the control circuit by means of back coupling the current measurement device of the transistor current flowing in the transistor cascade and by means of back coupling the voltage measurement device of the transistor voltage dropping across the transistor cascade.

Since the test resistance, i.e., the bidirectional transistor cascade, is connected between the active conductor and ground, the conductor-to-ground voltage acts as the interfering parameter acting on the control path, meaning that the actuating variable has to be continuously tracked in an alternating-voltage power supply system for maintaining the target resistance value. In a pure direct-voltage power supply system having constant voltage, the actuating variable would, in contrast, be constant for a predetermined target resistance value.

To shut down the control, i.e., switching the resistance value to infinity (equal to a vanishing current flow via the transistor cascade), the actual voltage is switched to zero in the controllable switch device.

The control is consequently switched off by the actual voltage—the out-put of the voltage measurement device—being drawn to the mass potential. The PI controller (cf. below) will reduce the control deviation during the shutting down of the actuating variable until this control deviation is constantly zero.

If the actual voltage is released again for a renewed switching-on of the control by closing the controllable switch device, the control deviation is initially negative due to the missing actual current. The PI controller follows this by continuously increasing the actuating variable until the control deviation has reached zero again.

Due to the fact that the actuating variable does not change in steps in the PI controller, the switching-off and the switching-on of the test resistance can advantageously be described as soft. The risk of overmodulation of the control path and undesired overcurrents are thus prevented. This control mechanism allows the control circuit to maintain its intended control behavior and leads to the soft switching-off and on.

Furthermore, the electric circuit arrangement comprises a microcontroller for specifying the target resistance value via a digital actuating element and for controlling the switch device by means of a switch signal.

The target resistance value is specified in digital form via the microcontroller and forwarded to the input of the transformation block as an analog signal via the digital setting element. The digital setting element can, for example, be realized as a digital potentiometer or a digital-to-analog converter.

In addition, the microcontroller makes a switch signal available which is supplied either directly or merged with other signals (overcurrent signal, overtemperature signal) to the switch device via a digital circuit.

Advantageously, the microcontroller is configured for specifying an amplitude-modulated resistance pattern from consecutive target resistance values.

The microcontroller can be installed for specifying a defined temporal progression of different target resistance values which are detected by the monitoring device when identifying the fault current as a signal sequence (fault-current signature) in order to trigger a certain action. For instance, this resistance pattern can be interpreted as a start signal for a test phase.

Advantageously, the electric circuit arrangement comprises an overtemperature detector for detecting an overtemperature of the transistor cascade and an overcurrent detector for detecting an overload value of the actual current, an overtemperature signal and an overcurrent signal being merged with an output signal of the microcontroller via a digital circuit in order to control the switch device by means of the switch signal.

The reliability of the electric circuit arrangement according to the invention is thereby ensured by safety switching-offs when an overcurrent and/or an overtemperature of the transistor cascade is detected.

Preferably, the digital circuit is realized as a set-reset flipflop.

Since switching off the control is to enable detecting overtemperature and overcurrent via the safety functions, independently of the switch signal of the microcontroller, the digital circuit is realized as a set-reset flipflop. Setting the set-reset flipflop, i.e., switching on the control, can only take place via the microcontroller in this instance. Resetting the set-reset flipflop, i.e., switching off the control, can take place via a disjunction of the overcurrent signal, overtemperature signal and via an output signal of the microcontroller.

Preferably, the controller is realized as a PI controller.

A PI controller is commonly used for the controller, the PI controller comprising a superimposed integral portion besides its proportional behavior (P portion) and thus not leading to a residual control deviation.

Advantageously, several circuit arrangements according to the invention are merged in a modular circuit arrangement, each of the electric circuit arrangements being assigned a different active conductor of the electric power supply system, and a central control unit being implemented for controlling and monitoring the electric circuit arrangements.

The electric circuit arrangement according to the invention, consisting of the transistor cascade and the control, can be regarded as a module which can be duplicated multiple times in order to be able to imprint fault resistances (test resistances) having different values at the same time at different positions in the power supply system.

In order to be able to switch test resistances to ground for all active conductors in a three-phase alternating-voltage power supply system, for example, the electric circuit arrangement according to the invention is consequently required three times and each one is connected to a different active conductor. This possibility thus ideally covers testing the standardized requirement for detecting symmetric insulation faults.

The modular circuit arrangement disposes over a central control unit which outputs the desired target resistance values to the module and monitors its function.

Furthermore, a communication connection between the central control unit and the monitoring device to be tested is intended.

Via this communication connection, data can be exchanged in both directions between the central control unit of the modular circuit arrangement and the monitoring device, e.g., to receive notification signals from the monitoring device to be tested or to activate an exact trigger-time measurement device. Having said that, the monitoring device to be tested can be notified via the communication connection starting from the modular circuit arrangement that a test is to be initiated.

The communication connection can be wired or wireless.

The electric circuit arrangement described above according to the invention is based on a method for the functional testing of a monitoring device for an electric power supply system, whereby a test resistance having a settable resistance value is switched between an active conductor of the power supply system and ground. In this context, the test resistance is realized as a bidirectional cascade consisting of field-effect transistors, and the resistance value is set to a predeterminable target resistance value in a continuous-value manner by means of an analog control.

Insofar, the technical effects mentioned above concerning the electric circuit arrangement and the advantages resulting therefrom also pertain to the method features.

In particular, the resistance value is set to a predeterminable target resistance value in a continuous-value manner by means of an analog control starting from a test resistance realized as a bidirectional cascade consisting of field-effect transistors and thus enables a flexible adjustment to the system environment and testing specifications with minimized installation size and less material.

What is more, the method can be used in combination with a central control unit in a modular circuit arrangement for a multi-phase power supply system in a manner in which several active conductors are each assigned an adjusted test resistance. For this purpose, the corresponding active conductor is connected to a circuit arrangement according to the invention, and a test resistance having a defined resistance value is set individually.

BRIEF DESCRIPTION OF THE DRAWING FIGURES

Further advantageous embodiment features are derived from the following description and the drawing which describe a preferred embodiment of the invention using examples.

DETAILED DESCRIPTION

Figure 1:
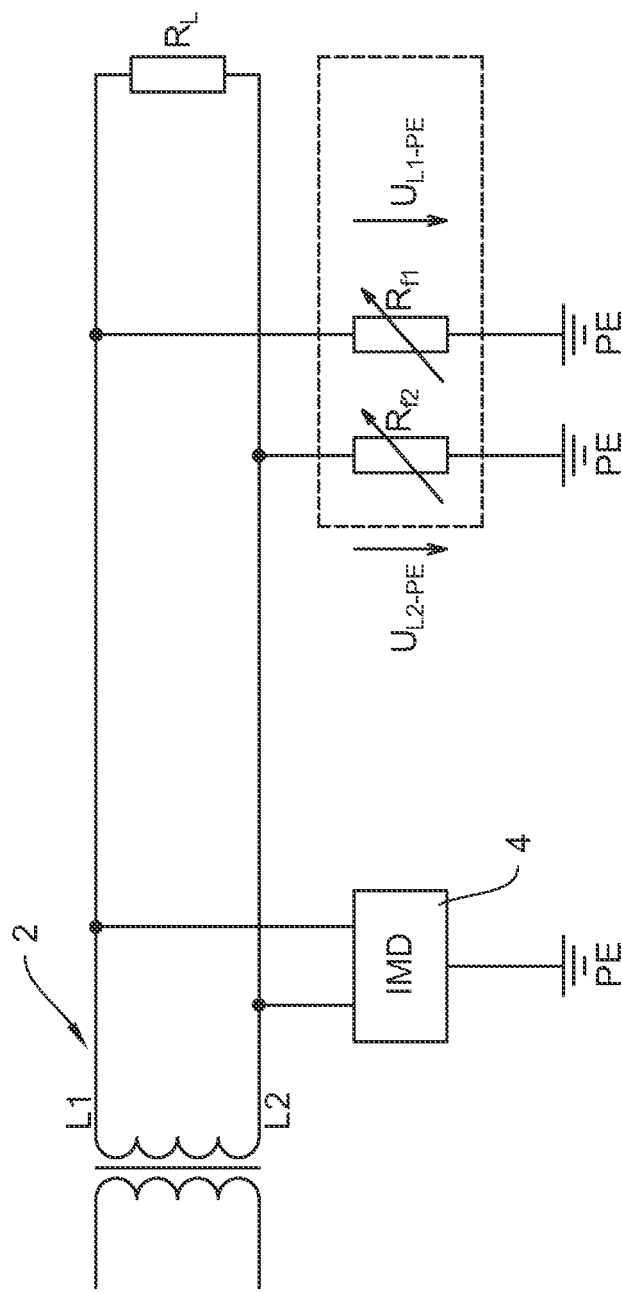
FIG. 1 shows a test arrangement having changeable test resistances according to the state of the art for the functional testing of an insulation monitoring device.

FIG. 1 shows a test arrangement according to the state of the art having changeable test resistances for the functional testing of an insulation monitoring device 4 installed in an ungrounded power supply system 2.

Power supply system 2 comprises two active conductors L1, L2 to which a consumer $R_L$ is switched. Insulation monitoring device 4 is connected to active conductors L1, L2 and ground (ground potential) PE for measuring an insulation resistance (measuring the fault resistance in power supply system 2).

For generating a defined fault resistance, changeable test resistances $R_{f1}$, $R_{f2}$ are disposed between active conductor L1, L2, respectively, and ground PE, the corresponding conductor-to-ground voltage $U_{L1-PE}$, $U_{L2-PE}$ dropping across the test resistances $R_{f1}$, $R_{f2}$. For the functional testing of insulation monitoring device 4, a closed measuring circuit is formed via each active conductor L1, L2, test resistance $R_{f1}$, $R_{f2}$ and ground PE back to insulation monitoring device 4, a fault current (measuring current), which can be evaluated in insulation monitoring device 4, flowing in the closed measuring circuit.

Figure 2:
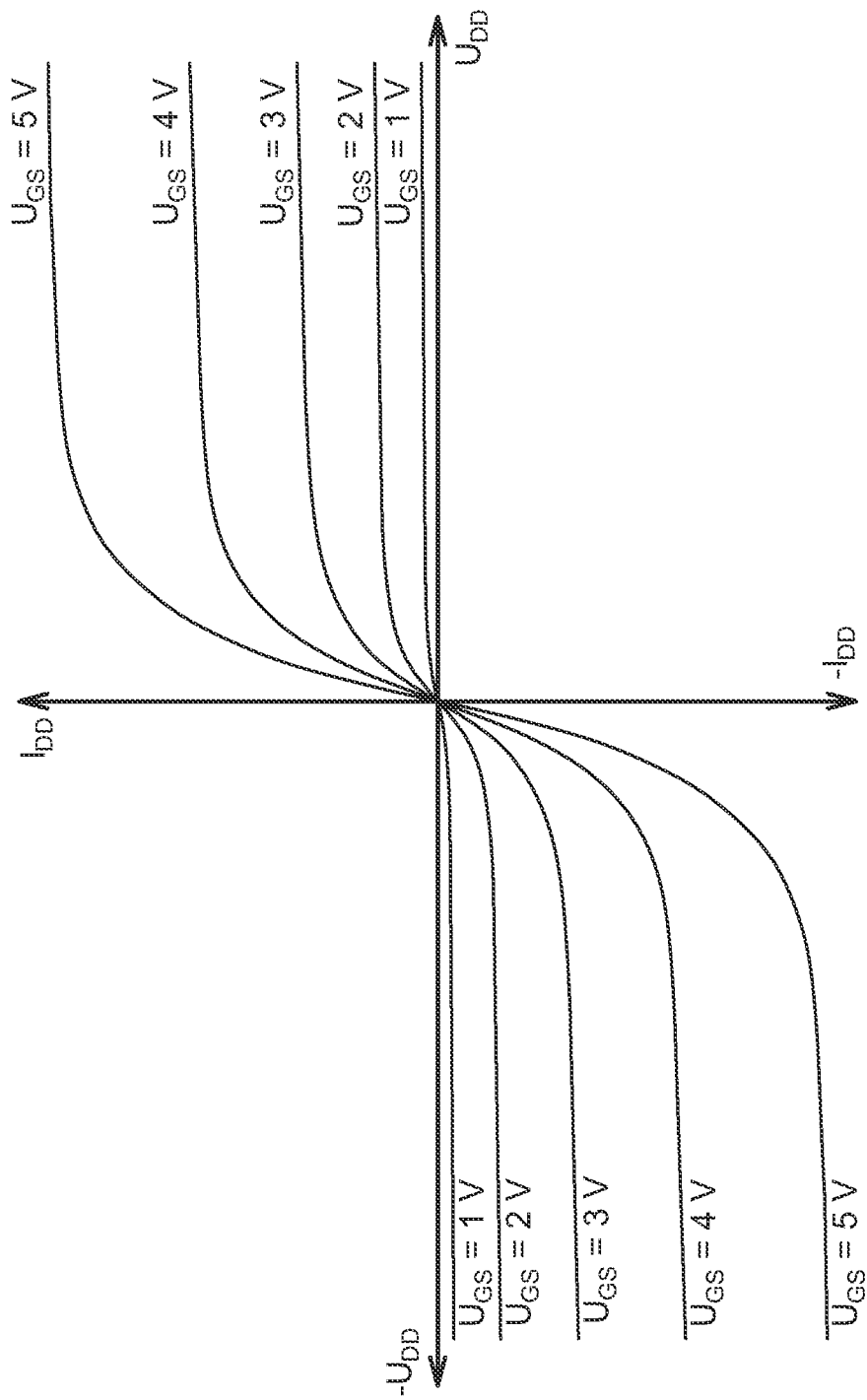
FIG. 2 shows a set of characteristic curves of a bidirectional MOSFET transistor cascade.

In FIG. 2, a set of characteristic curves of the bidirectional MOSFET transistor cascade is illustrated.

Preferably, the transistors used are MOSFETs. As a function of control voltage $U_{GS}$ a certain current $I_{DD}$ flowing via the cascade is set when voltage $U_{DD}$ is applied across the transistor cascade.

Bidirectional transistor cascade 12 consists of a series connection having two inversely disposed MOSFET transistors, meaning operating areas of transistor cascade 12 are derived in the first and third quadrant of the set of characteristic curves. Analog control 10 (FIG. 3) forces transistor cascade 12 into an ohmic behavior.

Figure 3:
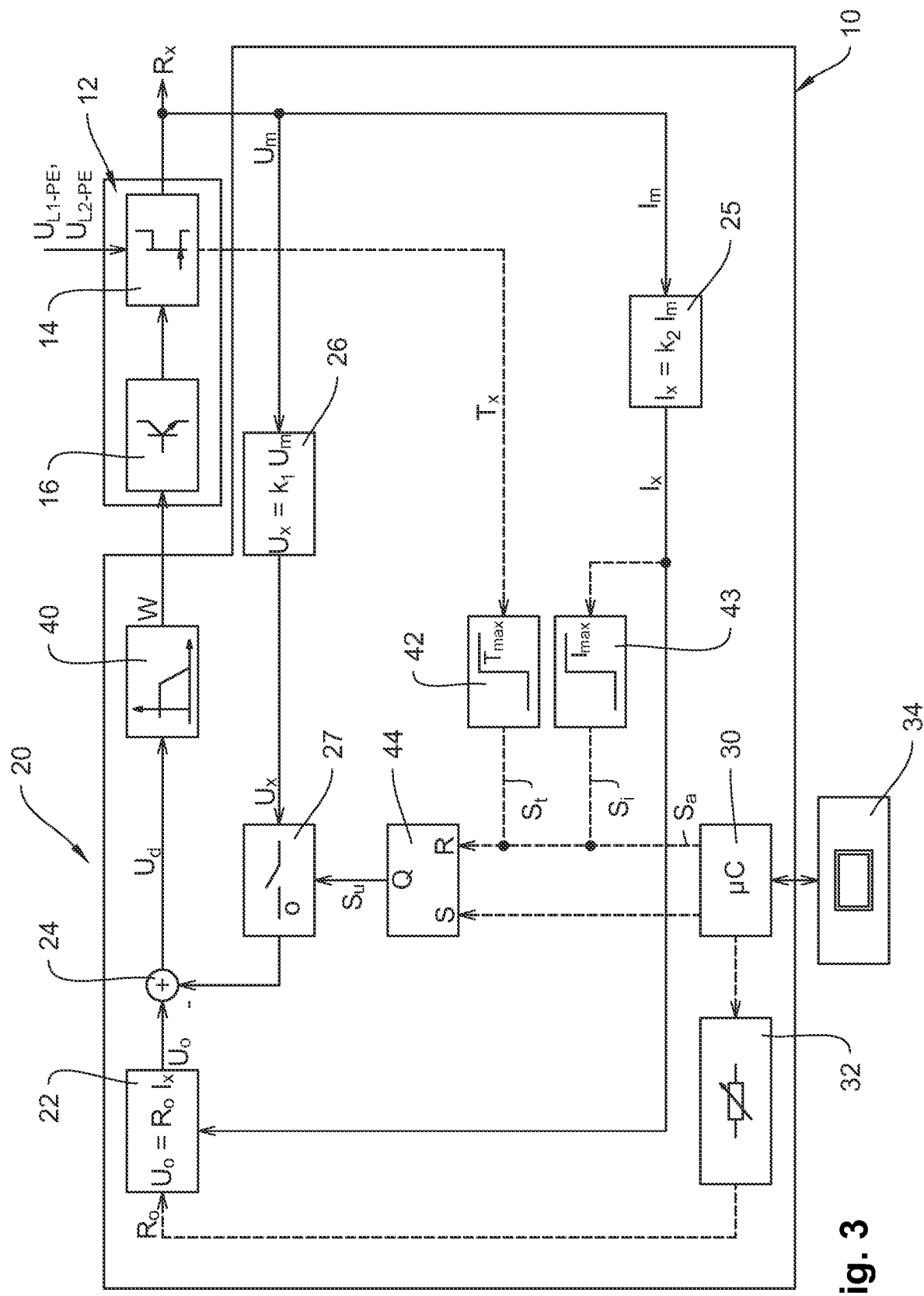
FIG. 3 shows an electric circuit arrangement according to the invention having a transistor cascade and analog control.

FIG. 3 shows electric circuit arrangement 20 according to the invention having bidirectional cascade 12 and control 10.

Initially, desired target resistance value $R_0$ is specified as the input parameter of control 10, target resistance value $R_0$ being transformed to target voltage $U_0$ via transformation block 22. The transformation takes place via current measurement device 25 which detects transistor current $I_m$ (corresponds to $I_{DD}$ in FIG. 2) flowing via transistor cascade 12 and supplies it to transformation block 22 in a scaled manner ($k_2$) as actual current $I_x$.

In comparison element 24, a residual voltage $U_d$ is formed from target voltage $U_0$ and actual voltage $U_x$, which is won via voltage measurement device 26 from transistor voltage $U_m$ dropping across transistor cascade 12 and is scaled ($k_1$). Residual current $U_d$ is supplied to controller 40—preferably a PI controller—which forms an actuating variable W therefrom for controlling transistor cascade 12.

Besides a real transistor path 14, transistor cascade 12 comprises a driver circuit 16 for controlling transistor path 14.

Control 10 effectuates setting actual resistance value $R_x$ of transistor path 14 of transistor cascade 12 to prespecified target resistance value $R_0$.

In order to be able to switch control 10 on and off, with particular emphasis on a soft switching-off and on, a switch device 27, which draws actual voltage $U_x$ to zero (mass potential), is provided between voltage measurement device 26 and comparison element 24.

Switch device 27 can be controlled directly by means of a switch signal $S_u$ by microcontroller 30 or via digital circuit 44.

Digital circuit 44 realized as a set-reset flipflop is to be provided if an actual temperature $T_x$ of transistor cascade 12 is detected by means of an overtemperature detector 42 and/or if an inadmissibly high value of actual current $I_x$ is determined by means of overcurrent detector 43 and an overtemperature signal $S_t$ and/or an overcurrent signal $S_i$ is output at the output of overtemperature detector 42 and/or of overcurrent detector 43. Overtemperature signal $S_t$ and overcurrent signal $S_i$ are merged with an output signal $S_a$ of microcontroller 30 to form switch signal $S_u$, which controls switch device 27, via set-reset flipflop 44.

Microcontroller 30 specifies target resistance value $R_0$ as the reference variable via digital setting element 32.

For the superordinate control, microcontroller 30 can be connected to a control device 34, such as a PC, laptop, smartphone or a stored program control (SPS).

Figure 4:
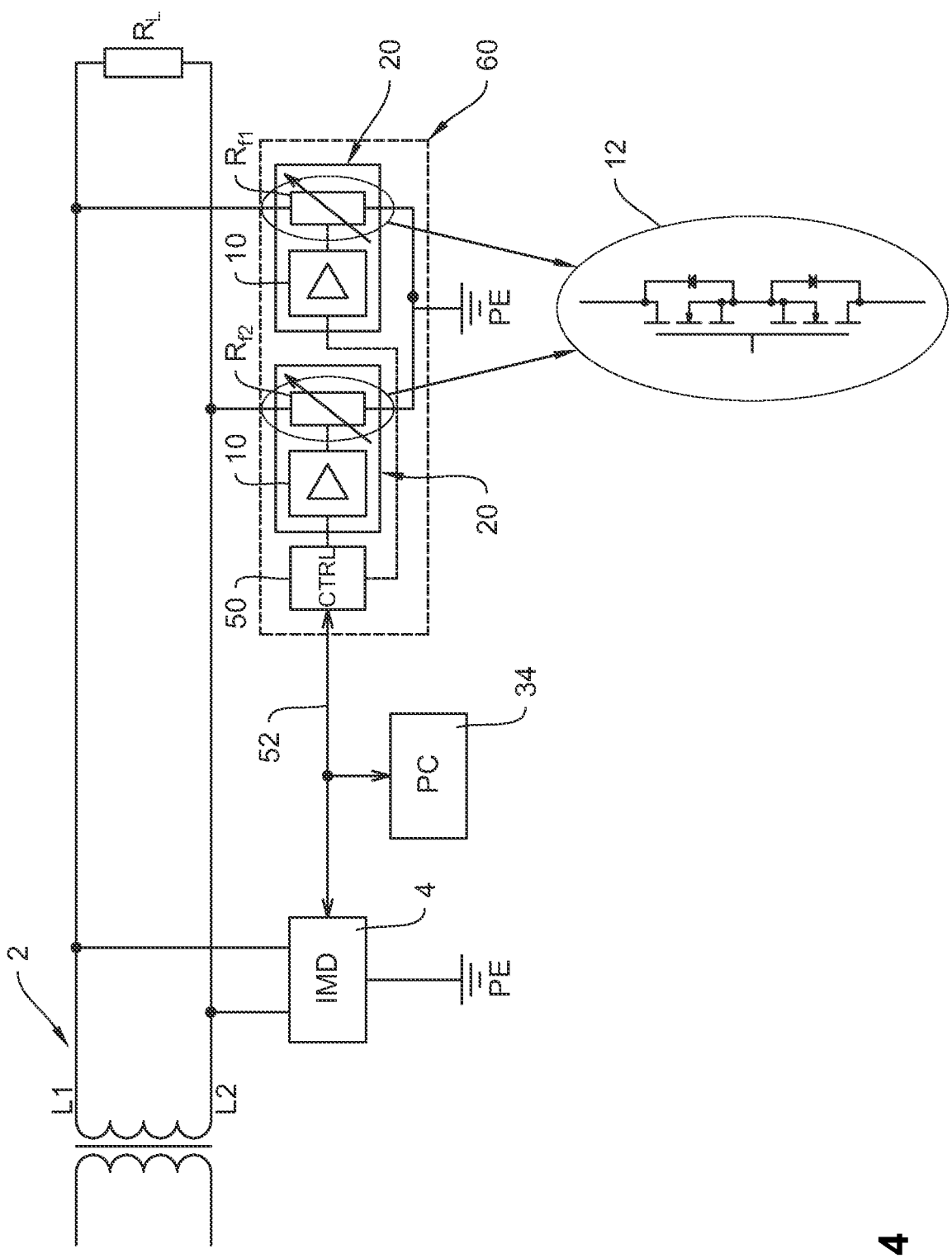
FIG. 4 shows a modular circuit arrangement having two circuit arrangements according to the invention.

FIG. 4 shows a modular circuit arrangement 60 having two circuit arrangements 20 according to the invention.

In this context, circuit arrangement 20 according to the invention is understood to be a module which simultaneously imprints different fault resistances $R_{f1}$, $R_{f2}$ at different positions, e.g., at different active conductors L1, L2 of power supply system 2.

Presently, first electric circuit arrangement 20 according to the invention is connected to active conductor L1 and second electric circuit arrangement 20 according to the invention is connected to conductor L2 and both are switched to ground. Both electric circuit arrangements 20 are controlled by a central control unit 50.

Central control unit 50 is connected to insulation monitoring device 4 to be tested via a communication connection 52. Via communication connection 52, all data, in particular data for signaling between modular circuit arrangement 60 and insulation monitoring device 4, can be exchanged.

Communication connection 52 itself can be wired or wireless and be integrated in a shared data network with control device 34.

The invention claimed is:

1. An electric circuit arrangement (20) for the functional testing of a monitoring device (4) for a power supply system (2), the electric circuit arrangement (20) having a test resistance ($R_{f1}$, $R_{f2}$) which is switched between an active conductor ($L_1$, $L_2$) of the power supply system (2) and ground (PE) and has a settable actual resistance value ($R_x$),
characterized by
a bidirectional cascade (12) consisting of field-effect transistors as test resistances ($R_{f1}$, $R_{f2}$) and by an analog control (10) for the continuous-value setting of the actual resistance value ($R_x$) to a predeterminable target resistance value ($R_0$).

2. The electric circuit arrangement (20) according to claim 1,
characterized in that
the control (10) comprises
a transformation block (22) which transforms the predeterminable target resistance value ($R_0$) to a target voltage ($U_0$) as a reference variable by means of an actual current ($I_x$);
a current measurement (25) which detects a transistor current ($I_m$) flowing through the transistor cascade (12) and supplies the transistor current ($I_m$) to the transformation block in a scaled manner as the actual current ($I_x$);
a comparison element (24) which compares the target voltage ($U_0$) to an actual voltage ($U_x$) and forms a differential voltage ($U_d$) as a control deviation;
a voltage measurement (26) which detects a transistor voltage ($U_m$) dropping via the transistor cascade (12) and supplies the transistor voltage ($U_m$) to the comparison element (24) in a scaled manner as the actual voltage ($U_x$);
a controller (40) which generates an actuating variable (W) from the differential voltage ($U_d$) for controlling a control path which is formed by the transistor cascade (12) having the resistance value as a control variable ($R_x$);
a controllable switch device (27) which switches the actual voltage ($U_x$) to zero to shut down the control (10).

3. The electric circuit arrangement (20) according to claim 2,
characterized by
a microcontroller (30) for predetermining the target resistance value ($R_0$) via a digital setting element (32) and for controlling the switch device (27) by means of a switch signal ($S_u$).

4. The electric circuit arrangement (20) according to claim 3,
characterized in that
the microcontroller (30) is configured for specifying an amplitude-modulated resistance pattern from consecutive target resistance values ($R_0$).

5. The electric circuit arrangement (20) according to claim 3,
characterized in that
the control (10) comprises an overtemperature detector (42) for detecting an overtemperature of the transistor cascade (12) and an overcurrent detector (43) for detecting an overload value of the actual current ($I_x$), an overtemperature signal ($S_t$) and an overcurrent signal ($S_i$) being merged with an output signal ($S_a$) of the microcontroller (30) via a digital circuit (44) for controlling the switch device (27).

6. The electric circuit arrangement (20) according to claim 5,
characterized in that
the digital circuit (44) is realized as a set-reset flipflop.

7. The electric circuit arrangement (20) according to claim 2,
characterized in that
the controller (40) is realized as a PI controller.

8. A modular circuit arrangement (60) consisting of several electric circuit arrangements (20) according to claim 1,
characterized in that
each of the electric circuit arrangements (20) is assigned a different active conductor ($L_1$, $L_2$) of the electric power supply system (2), and a central control unit (50) is implemented for controlling and monitoring the electric circuit arrangements (20).

9. The modular circuit arrangement (60) according to claim 8,
characterized by
a communication connection (52) between the central control unit (50) and the monitoring device (4).

10. A method for the functional testing of a monitoring device (4) for an electric power supply system (2), the method comprising the following steps:
switching a test resistance ($R_{f1}$, $R_{f2}$) having a settable actual resistance value ($R_x$) between an active conductor ($L_1$, $L_2$) of the power supply system (2) and ground (PE),
characterized in that
the test resistance ($R_{f1}$, $R_{f2}$) is a bidirectional cascade (12) consisting of field-effect transistors and in that the setting of the actual resistance value ($R_x$) to a predeterminable target resistance value ($R_0$) takes place in a continuous-value manner by means of an analog control (10).

11. The method according to claim 10,
characterized in that
via the control (10)
the predeterminable target resistance value ($R_0$) is transformed to a target voltage ($U_0$) in a transformation block (22) as a reference variable by means of an actual current ($I_x$);
a current measurement device (25) detects a transistor current ($I_m$) flowing through the transistor cascade (12) and supplies the transistor current ($I_m$) to the transformation block (22) in a scaled manner as the actual current ($I_x$);
the target voltage ($U_0$) is compared to an actual voltage ($U_x$) in a comparison element (24) and a differential voltage ($U_d$) is formed as a control deviation;
a voltage measurement device (26) detects a transistor voltage ($U_m$) dropping via the transistor cascade (12) and supplies the transistor voltage ($U_m$) to the comparison element (24) in a scaled manner as the actual voltage ($U_x$);
an actuating variable (W) is generated from the differential voltage ($U_d$) by means of a controller (40) in order to control a control path, which is formed by the transistor cascade (12) having the actual resistance value ($R_x$) as a control variable; and
a controllable switch device (27) switches the actual voltage ($U_x$) to zero using to shut down the control (10).

12. The method according to claim 11,
characterized in that
a microcontroller (30) specifies the target resistance value ($R_0$) via a digital setting element (32) and controls the switch device (27) by means of a switch signal.

13. The method according to claim 12,
characterized in that
the microcontroller (30) specifies an amplitude-modulated resistance pattern from consecutive target resistance values ($R_0$).

14. The method according to claim 12,
characterized by
detecting an overtemperature of the transistor cascade in the control (10) by means of an overtemperature detector;
detecting an overload value of the actual current ($I_x$) by means of an overcurrent detector (43), an overtemperature signal ($S_t$) and an overcurrent signal ($S_i$) being merged with an output signal ($S_a$) of the microcontroller (30) via a digital circuit (44) for controlling the switch device (27).

15. The method according to claim 14,
characterized in that
the digital circuit (44) is implemented as a set-reset flipflop.

16. The method according to claim 11,
characterized in that
the controller (40) performs a PI control.

\* \* \* \* \*